(12) United States Patent
Iyengar et al.

(10) Patent No.: US 11,721,641 B2
(45) Date of Patent: Aug. 8, 2023

(54) WEIGHT OPTIMIZED STIFFENER AND SEALING STRUCTURE FOR DIRECT LIQUID COOLED MODULES

(71) Applicant: Google LLC, Mountain View, CA (US)

(72) Inventors: Madhusudan K. Iyengar, Foster City, CA (US); Connor Burgess, Alameda, CA (US); Padam Jain, San Jose, CA (US); Emad Samadiani, Mountain View, CA (US); Yuan Li, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 60 days.

(21) Appl. No.: 16/877,730

(22) Filed: May 19, 2020

(65) Prior Publication Data

US 2021/0366841 A1    Nov. 25, 2021

(51) Int. Cl.
*H01L 23/00* (2006.01)
*H01L 23/16* (2006.01)
*H01L 23/473* (2006.01)

(52) U.S. Cl.
CPC ............ *H01L 23/562* (2013.01); *H01L 23/16* (2013.01); *H01L 23/473* (2013.01)

(58) Field of Classification Search
None
See application file for complete search history.

(56) References Cited

U.S. PATENT DOCUMENTS

| | | |
|---|---|---|
| 5,778,523 A | 7/1998 | Sylvester |
| 6,315,605 B1 | 11/2001 | Billman et al. |
| 7,459,782 B1 | 12/2008 | Li |
| 8,847,383 B2 | 9/2014 | Mclellan et al. |
| 10,083,920 B1 | 9/2018 | Edwards et al. |
| 10,561,040 B1 | 2/2020 | Lunsman et al. |
| 2006/0260784 A1 | 11/2006 | Bezama et al. |
| 2007/0034356 A1 | 2/2007 | Kenny et al. |
| 2008/0284047 A1 | 11/2008 | Tosaya et al. |
| 2011/0304979 A1 | 12/2011 | Peterson et al. |
| 2014/0252585 A1* | 9/2014 | Chen ............... H01L 23/473 257/692 |

(Continued)

FOREIGN PATENT DOCUMENTS

| | | | |
|---|---|---|---|
| CN | 110828405 A | 2/2020 | |
| DE | 102019120130 A1 * | 2/2020 | ........... B60R 16/033 |

(Continued)

OTHER PUBLICATIONS

Extended European Search Report for European Patent Application No. 20211008.6 dated May 28, 2021. 8 pages.

(Continued)

*Primary Examiner* — Nilufa Rahim

(74) *Attorney, Agent, or Firm* — Lerner David LLP

(57) ABSTRACT

A weight optimized stiffener for use in a semiconductor device is disclosed herein. In one example, the stiffener is made of AlSiC for its weight and thermal properties. An O-ring provides sealing between a top surface of the stiffener and a component of the semiconductor device and adhesive provides sealing between a bottom surface of the stiffener and another component of the semiconductor device. The stiffener provides warpage control for a lidless package while enabling direct liquid cooling of a chip or substrate.

18 Claims, 8 Drawing Sheets

(56) References Cited

U.S. PATENT DOCUMENTS

| | | | | |
|---|---|---|---|---|
| 2014/0254098 | A1* | 9/2014 | Arvelo | F28D 15/00 |
| | | | | 361/699 |
| 2016/0358836 | A1 | 12/2016 | Colgan et al. | |
| 2017/0019988 | A1 | 1/2017 | McGrane et al. | |
| 2017/0053845 | A1* | 2/2017 | Interrante | H01L 21/4882 |
| 2019/0172767 | A1* | 6/2019 | Kwon | H01L 23/16 |
| 2021/0020459 | A1* | 1/2021 | Shah | H01L 21/6835 |
| 2021/0287958 | A1* | 9/2021 | Langut | H01L 23/16 |

FOREIGN PATENT DOCUMENTS

| | | |
|---|---|---|
| DE | 102019120130 A1 | 2/2020 |
| EP | 0742681 A2 | 11/1996 |

OTHER PUBLICATIONS

Office Action for Taiwanese Patent Application No. 109132017 dated May 22, 2023. 12 pages (p. 12 categorizing the cited references).

* cited by examiner

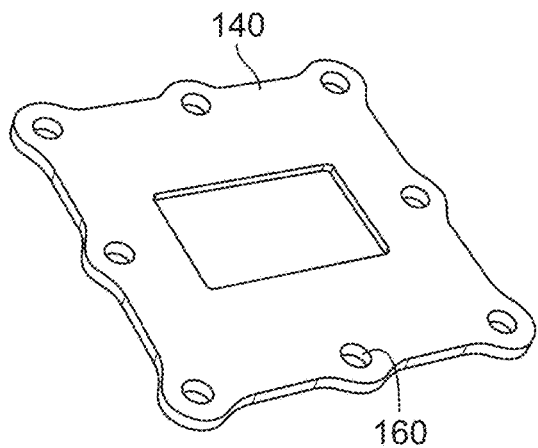
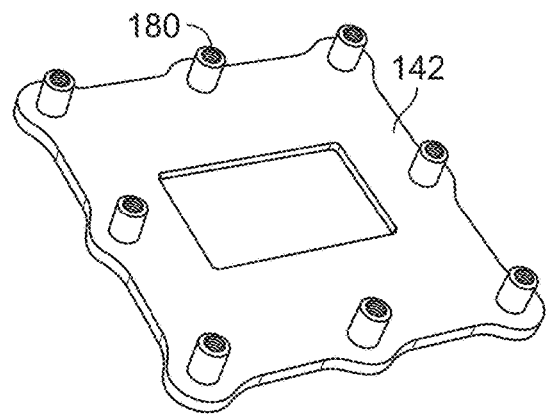
FIG. 2A
FIG. 2B
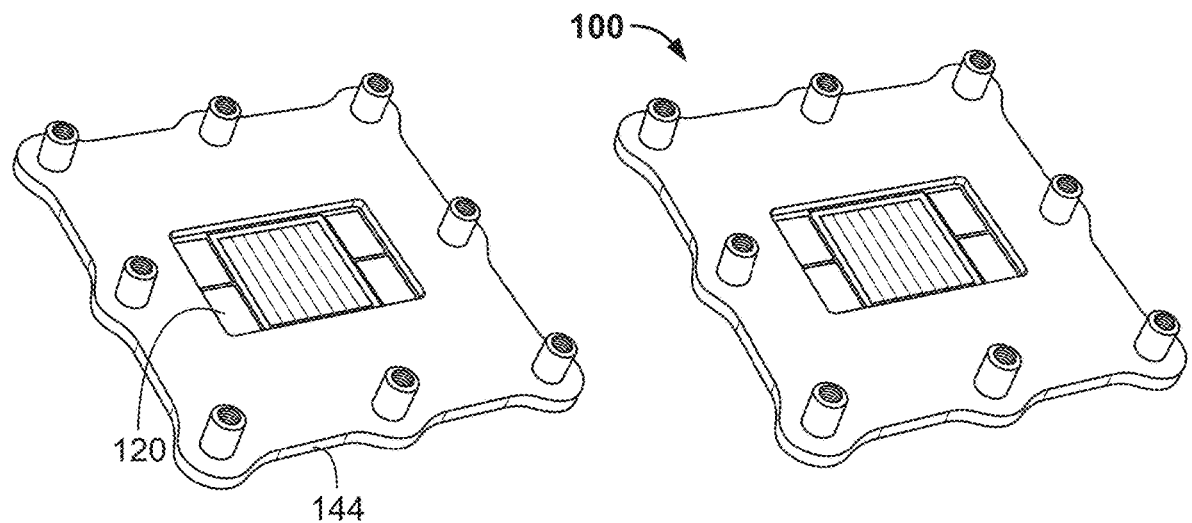
FIG. 2C
FIG. 2D

| Material | Coefficient of Expansion (ppm/C) | Thermal Conductivity (W/mK) | Strain at +50 deg C(%) | Relative strain (%) |
|---|---|---|---|---|
| Circuit Board (in plane) | 15 | 0.9 | 0.075% | - |
| 304 Stainless Steel | 17.3 | 14.4 | 0.087% | 0.012% |
| Copper | 16.3 | 400 | 0.082% | 0.007% |
| AlSiC | 7.5 | 185 | 0.038% | -0.038% |

WEIGHT OPTIMIZED STIFFENER AND SEALING STRUCTURE FOR DIRECT LIQUID COOLED MODULES

BACKGROUND

Complementary Metal Oxide Semiconductor ("CMOS") circuits are found in several types of electronic components, including microprocessors, batteries, and digital camera image sensors. The main features of CMOS technology are low static power consumption and high noise immunity.

In addition to industry standard chip packages, the exploration of special purpose silicon is likely to result in high power heat sources in servers. This technology may also be applied to graphics processing units ("GPUs") and custom application-specific integrated circuits ("ASICs"). Further, services such as imaging and artificial intelligence ("AI") will likely require large compute resources at a high density, with many servers in close proximity to one another. Data centers around the globe are being mandated to simultaneously increase energy efficiency, consolidate operations and reduce costs. To accommodate these high performance and high density servers, data center operators must grapple with not only the increased power densities but also the thermal challenges that they present.

Because liquid is many times better at storing and transferring heat than air, liquid cooling solutions can provide immediate and measurable benefits to compute efficiency, density and performance. The use of direct liquid cooled modules can increase compute performance and density and decrease energy consumption.

Electronic component packages are subject to a wide range of temperature differentials. Due to differences in the thermal coefficient of expansion ("CTE") of the various package components, the electronic component package may warp as the temperature of the electronic component package changes.

BRIEF SUMMARY

The present disclosure provides a weight optimized stiffener that provides warpage control for a lidless package while enabling direct liquid cooling of a chip and/or substrate. The stiffener may be composed from weight optimization material, and its geometric features may further provide for weight optimization. The weight optimization of the stiffener reduces its thermal mass and the impact of weight concentrations during attachment of the stiffener to a circuit assembly.

One aspect of the disclosure provide a device, comprising a weight optimized stiffener having a top surface, a bottom surface, an irregularly shaped outer periphery, and an inner periphery forming an aperture through the top and bottom surfaces, wherein the aperture is adapted to receive a portion of a substrate coupled to the bottom surface of the stiffener by an adhesive. The stiffener may be formed of silicon carbide particles in an aluminum matrix. According to some examples, the device may further include a substrate coupled to the bottom surface of the stiffener by an adhesive, a portion of the substrate protruding into the aperture of the stiffener. For example, the bottom surface of the stiffener may have at least one recess for receiving at least one protrusion on the substrate. According to other examples, the bottom surface of the stiffener has a plurality of protrusions extending therefrom that lie adjacent to outer side surfaces of the substrate when the substrate is coupled to the bottom surface of the stiffener. The device may further include a top plate coupled to the top surface of the stiffener, and an O-ring for providing a seal between the stiffener and the top plate. Where the stiffener has a plurality of holes corresponding to a plurality of holes in the top plate, each of the plurality of holes in the stiffener may form a pair with a respective one of the plurality of holes in the top plate, each pair of the plurality of holes adapted to receive a portion of a fastener therethrough for coupling the top plate to the stiffener. The top plate may have a groove in an inner surface thereof that is configured to retain the O-ring when the top plate is coupled to the stiffener.

In some examples, the device may further include a manifold configured to lie within an enclosure formed by the substrate, stiffener and top plate, the manifold configured to direct cooled liquid to the substrate. For example, a portion of the manifold may lie within the aperture of the stiffener and is in direct contact with the substrate when the manifold is within the enclosure formed by the substrate, stiffener and top plate.

Another aspect of the disclosure provides an assembly, comprising a weight optimized stiffener having a top surface, a bottom surface, an outer periphery and an inner periphery forming an aperture through the top and bottom surfaces, and a substrate coupled to the bottom surface of the stiffener by an adhesive, a portion of the substrate protruding into the aperture of the stiffener. The stiffener may be formed of silicon carbide particles in an aluminum matrix. The bottom surface of the stiffener may have at least one recess for receiving at least one protrusion on the substrate, and a plurality of protrusions extending therefrom that lie adjacent to outer side surfaces of the substrate when the substrate is coupled to the bottom surface of the stiffener. In some examples, the assembly may further include a top plate coupled to the top surface of the stiffener, and an O-ring for providing a seal between the stiffener and the top plate.

Yet another aspect of the disclosure provides a method of assembling a semiconductor device for providing warpage control to a direct liquid cooled module. The method includes providing a weight optimized stiffener having a top surface, a bottom surface, an outer periphery and an inner periphery forming a central aperture through the top and bottom surfaces, providing a substrate having a top surface including circuitry on at least a first region of the top surface, and coupling the top surface of the substrate to the bottom surface of the stiffener such that the first region of the top surface of the substrate is accessible through the aperture of the stiffener.

BRIEF DESCRIPTION OF THE DRAWINGS

FIGS. 2A-D show an exemplary fabrication method of the subassembly of FIG. 1.

DETAILED DESCRIPTION

Figure 1:
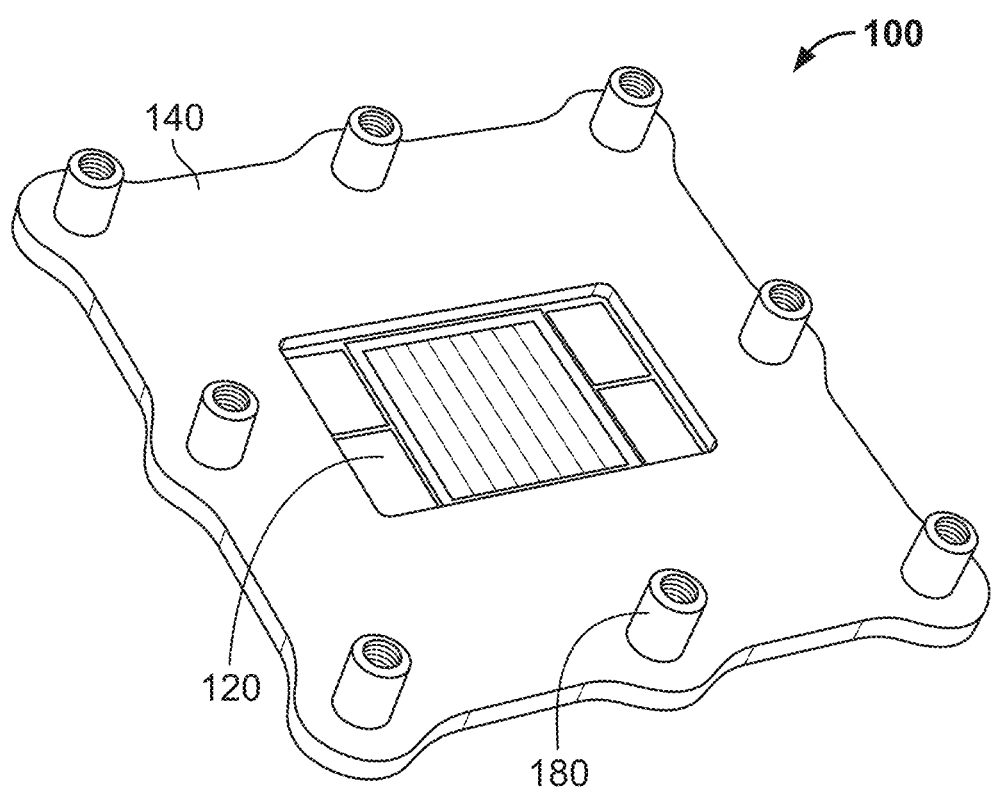
FIG. 1 is a perspective view of a subassembly including a chip bonded to a stiffener with threaded hardware installed thereto.

FIG. 1 is a perspective view of a package subassembly 100 of a semiconductor device including a substrate 120 bonded to stiffener 140 with fasteners or threaded hardware 180 installed thereto.

The stiffener 140 has a top surface, a bottom surface and an aperture through the top and bottom surfaces. The aperture may be generally central with respect to an outer perimeter of the stiffener 140, though in other examples the position of the aperture may be adjusted. For example, the size and shape and position of the aperture may be adapted based on circuitry of the underlying substrate 120 to be exposed through the aperture.

The substrate 120 may be coupled to the bottom surface of the stiffener, such as by an adhesive or other bonding techniques. A portion of stiffener 140 may cover a portion of the substrate 120 when the substrate is coupled to the bottom surface of the stiffer. For example, the substrate may include circuitry on a least a first region on its top surface. The circuitry may include, by way of example only, microprocessors, memory, or other chips or components. When the substrate is assembled with the stiffener, the first region of the substrate including the circuitry may be accessible through the aperture of the stiffener. The portion of the substrate covered by the stiffener may be, for example, dead space or circuitry that does not need to be accessible.

According to some examples, described further below, the stiffener 140 and substrate 120 may be included in an assembly, wherein a top plate is coupled to the top surface of the stiffener and an O-ring provides a seal between the stiffener and top plate.

FIGS. 2A-D show an example assembly method of subassembly 100. In FIG. 2A, stiffener 140 is sintered together. The stiffener may be formed of silicon carbide particles in an aluminum matrix, as one example. Post processing is completed, such as refining the peripheries of the stiffener, sanding the top or bottom surfaces thereof or ensuring holes and apertures meet specifications. In FIG. 2B, threaded hardware 180 is installed to a top surface 142 of stiffener 140. In FIG. 2C, a substrate and/or chip is bonded to a bottom surface or underside 144 of stiffener 140. In FIG. 2D, subassembly 100 is sputter coated before being soldered to a motherboard. While FIGS. 2A-2D provide one example, it should be understood that variations may be made. For example, coupling techniques other than bonding may be used, different coating techniques may be used, etc. For example, the stiffener could be coated or plated with different metals or polymers for adhesion improvement. In further examples, the stiffener could be made to be compatible for using a solder based or polymer adhesive based bonding.

Figure 3A:
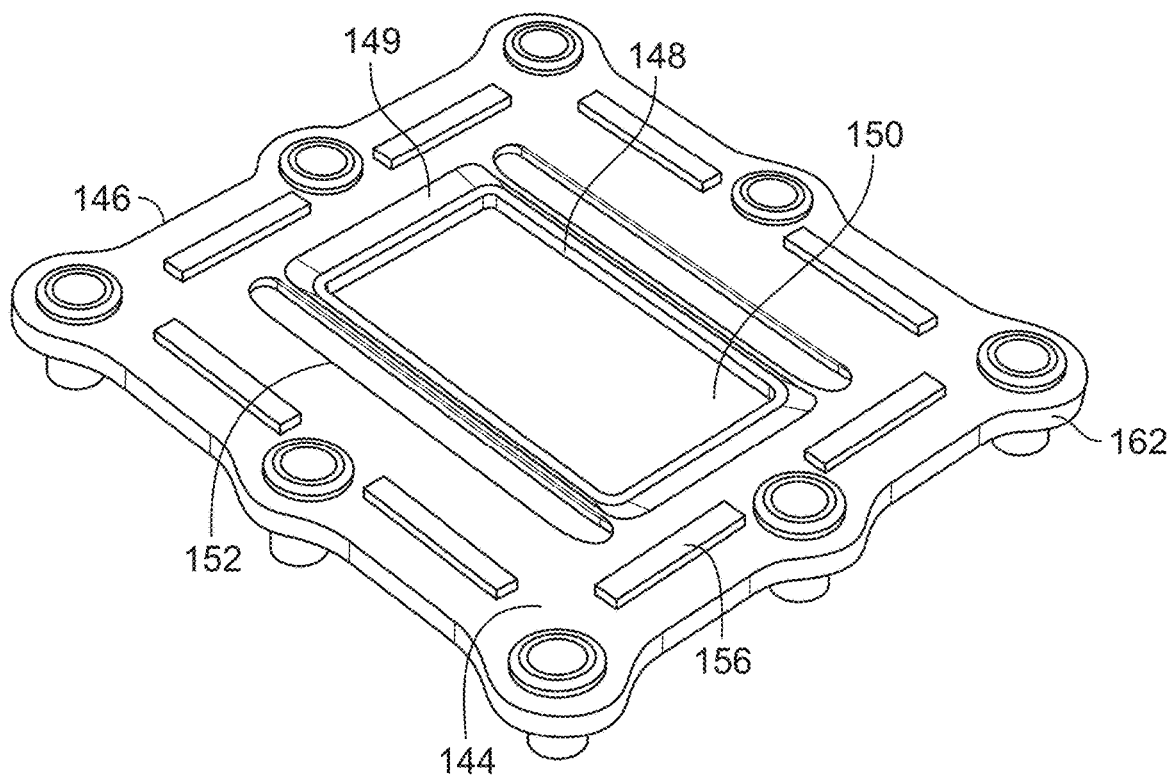
FIG. 3A is a perspective view of an underside of the stiffener with the installed hardware of FIG. 1.

FIG. 3A is a perspective view of an underside 144 of stiffener 140. The underside 144 of the stiffener 140 may have at least one groove for receiving at least one protrusion extending from a chip and/or substrate. For example, first and second grooves in the stiffener may be configured to receive respective first and second protrusions of the substrate.

According to one example, the protrusions extending from the underside 144 may each lie parallel to an edge of the central aperture of the stiffener. When the substrate is coupled to the bottom surface of the stiffener each of the plurality of protrusions may lie adjacent to a respective outer side surface of the substrate. In one example, the stiffener may have four protrusions in which each protrusion is configured to lie adjacent a respective outer surface side of a rectangular chip on the substrate when the substrate is coupled to the bottom surface of the stiffener. In other examples, additional or fewer protrusions may be included.

Stiffener 140 has an irregularly shaped outer periphery or perimeter 146. The aperture 150 defines an inner periphery or perimeter 148. Aperture 150 extends through top and bottom surfaces 142, 144 of stiffener 140. Bottom surface 144 of stiffener may include at least one groove 152 therein.

FIG. 3A shows a stiffener 140 with two recesses or grooves 152 adjacent the longer sides of inner periphery 148. A ramp surface 149 extending from bottom surface 144 toward top surface 142 of stiffener 140 is also provided. Ramp surfaces 149 are adjacent each of the shorter sides of inner periphery 148. Protrusions 156 extending outwardly from bottom surface 144 of stiffener 140 are also provided. Two protrusions 156 are shown forming a pair of protrusions 156 on each side of stiffener 140 for a total of eight protrusions 156 extending outwardly from a bottom surface of stiffener 140. Stiffener 140 also includes peripheral apertures 160 extending through the top and bottom surfaces 142, 144 thereof. As shown in FIG. 2A, stiffener 140 includes eight peripheral apertures 160. This is just one example of the number of recesses or grooves 152, protrusions 156 and peripheral apertures 160 that stiffener 140 may have. In other examples, stiffener 140 may have more or less than two recesses or grooves 152, more or less than two protrusions 156 and more or less than eight peripheral apertures 160.

Irregularly shaped outer periphery 146 of stiffener 140 may provide for weight optimization. Instead of a rectangular outer periphery, stiffener 140 is designed with a peripheral curve 162 about each peripheral aperture 160. Each curve on a side surface of the stiffener may be approximately 180° while each curve on a corner of the stiffener may be approximately 270°. The lead line of element 162 shown in FIG. 3A is to a corner of the outer periphery 146 of stiffener 140 while the curves adjacent this corner are on the aforementioned sides surfaces of stiffener 140. The empty space between each adjacent curves 162 reduces the weight of the stiffener while still providing the structural area needed to control warpage.

Hardware 180 is installed through each of peripheral apertures 160 of stiffener 140. Each fastener or hardware 180 has a base 184, a shaft 186 and a threaded hole 188. To couple each hardware 180 to stiffener 140, shaft 186 is inserted through hole 188 from the bottom surface 144 and though the top surface 142 of stiffener 140 until based 184 come into directed contact with bottom surface 144. According to some examples, each fastener aperture or hole in the stiffener corresponds to a respective aperture or hole in the top plate. For example, each of the plurality of holes in the stiffener forms a pair with a respective one of the plurality of holes in the top plate. Each pair of the plurality of holes is adapted to receive a portion of a fastener therethrough for coupling the top plate to the stiffener.

Hardware 180 may be utilized that can attach to a microprocessor such that it can handle the pressure loads under a direct liquid cooling regime while still being light enough to be soldered to a motherboard and handled in a high volume production environment. For example, a manifold may be configured to lie within an enclosure formed by the substrate, stiffener and top plate. The manifold may be configured to supply cooled liquid to the substrate. A portion of the manifold may lie within the central aperture of the stiffener in direct contact with the substrate when the manifold is within the enclosure formed by the substrate, stiffener and top plate.

Figure 3B:
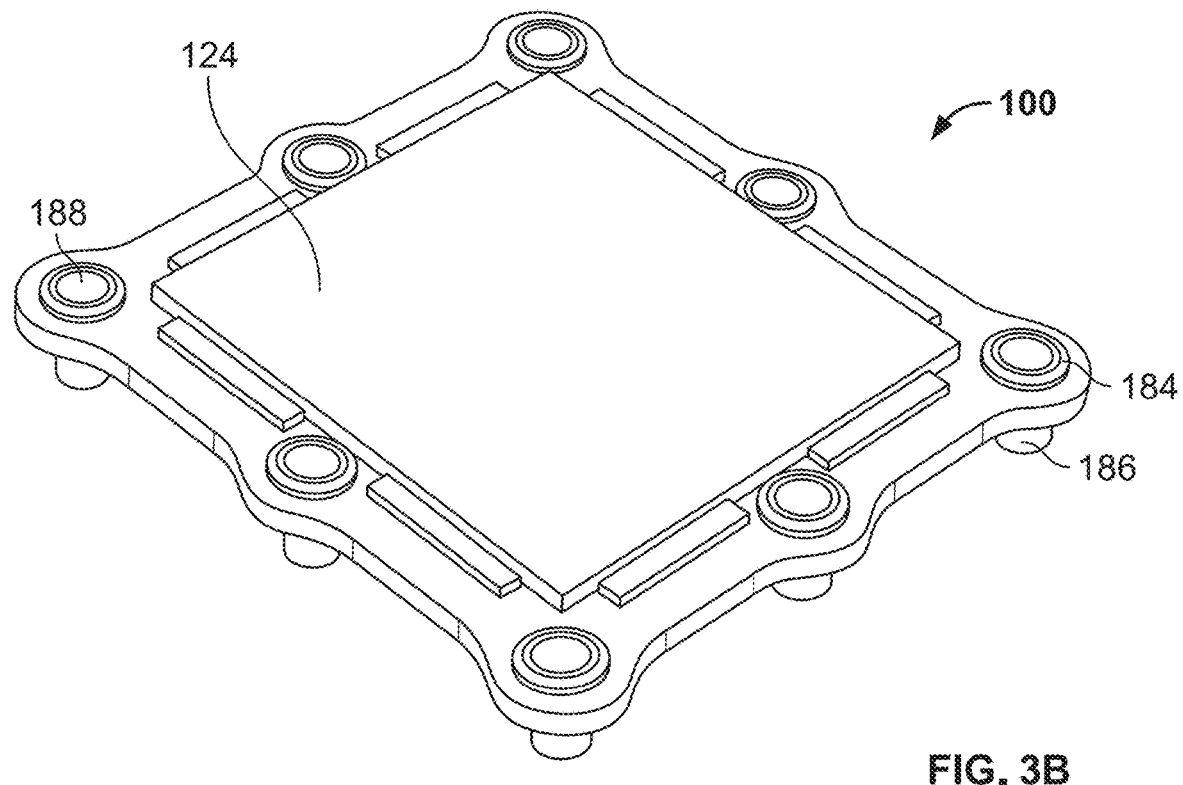
FIG. 3B is a perspective view of the underside of the subassembly of FIG. 1.
Figure 4A:
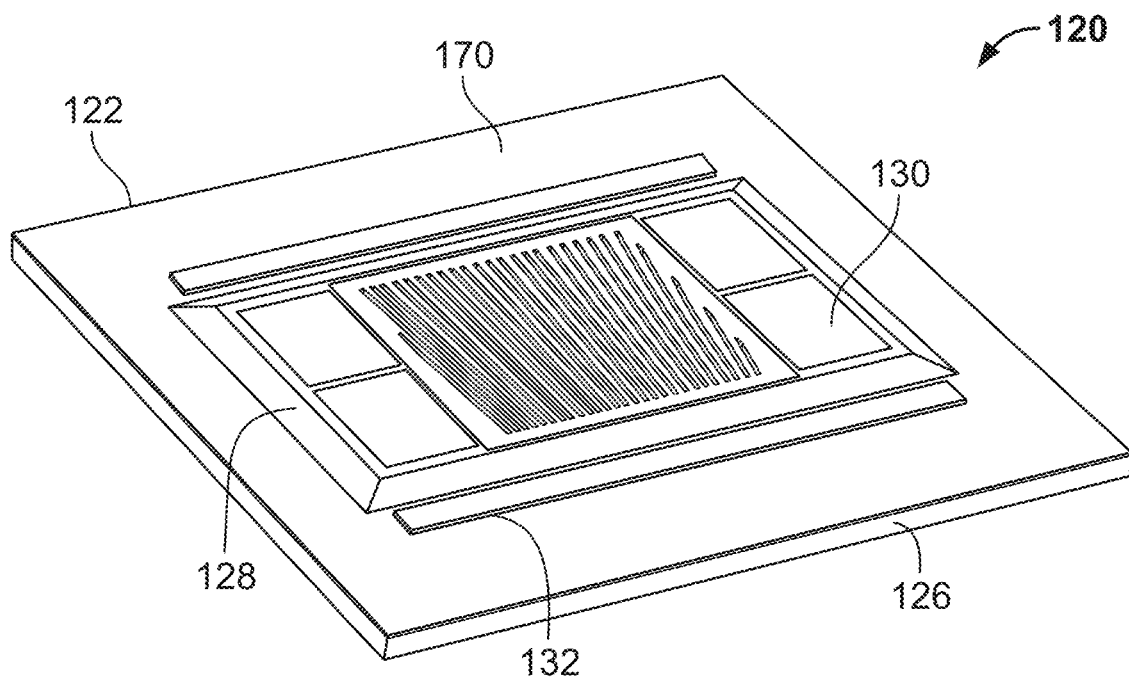
FIG. 4A is a perspective view an exemplary chip.
Figure 4B:
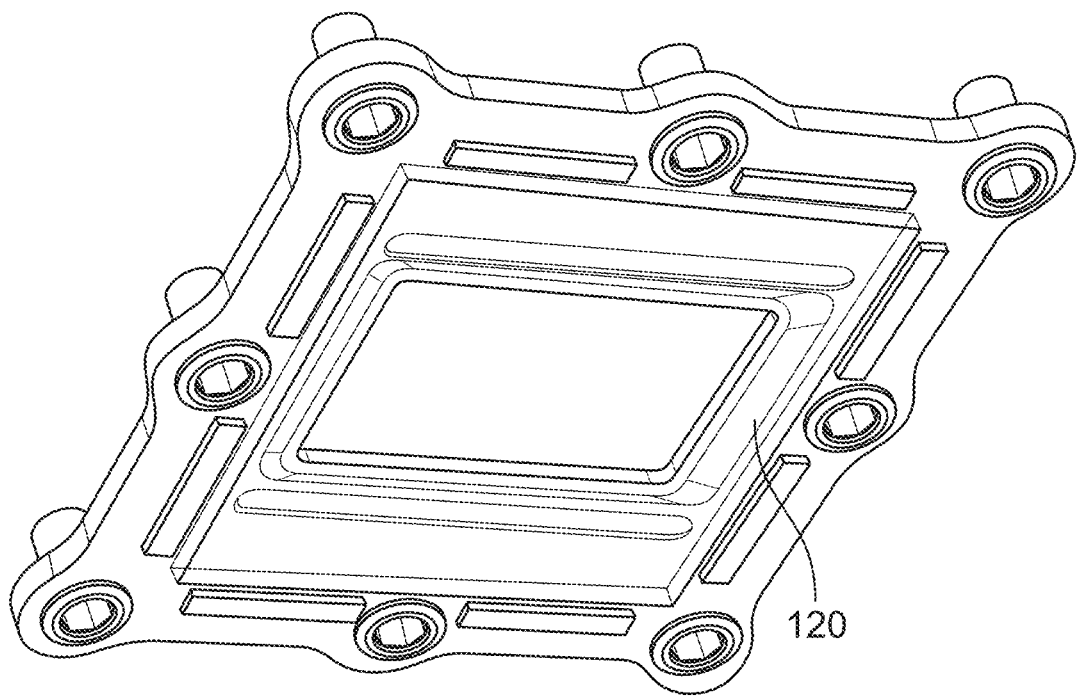
FIG. 4B is a perspective view the chip of FIG. 4A shown bonded to an underside of a stiffener.

As shown in FIGS. 3B and 4B, a substrate 120 is coupled to a bottom surface 144 of stiffener 140. Subassembly 100 includes a substrate 120 which also includes a die 130 which may also be referred to as a chip. The die 130 may be an integrated circuit ("IC") chip, system on chip ("SoC"), or portion thereof, that may include various passive and active microelectronic devices such as resistors, capacitors, inductors, diodes, metal-oxide semiconductor field effect ("MOSFET") transistors, CMOS transistors, bipolar junction transistors ("BJTs"), laterally diffused metal-oxide-silicon ("LDMOS") transistors, high power MOS transistors, other types of transistors, or other types of devices. The die 130 may comprise a memory device, a logic device, or other types of circuits, as examples. Die 130 is shown bonded to a carrier substrate or substrate 120. Substrate 120 can be, for example, a silicon substrate, a plastic substrate, a flexible substrate having polyimide and copper layers for example, a laminate substrate, a ceramic substrate, an interposer, or any other suitable support structure.

Substrate 120 includes a top surface 122, a bottom surface 124 and side surfaces 126 extending between top and bottom surfaces 122, 124. Top surface 122 also includes a ramp surface 128 extending outwardly thereof that forms a perimeter of chip 130. Adjacent the longer sides of chip 130 are protrusions 132 that also extending outwardly from top surface 122 of substrate 120.

Prior to bonding top surface 122 of substrate 120 to bottom surface 144 of stiffener, a layer of adhesive 170 may be applied to the top surface of substrate 120 and/or the bottom surface 144 of stiffener 140. As an example, FIG. 4A shows adhesive 170 applied to top surface 122 of substrate 120. The adhesive is used to mechanically couple together substrate 120 and stiffener 140. Any type of adhesive used in the industry including but not limited to natural adhesive, synthetic adhesive, drying adhesives, thermoplastic adhesives, reactive adhesives, pressure sensitive adhesives, or any other commonly used adhesive may be used.

When positioning substrate 120 with respect to stiffener 140 prior to bonding of these components, protrusions 132 of substrate are positioned within grooves 152 of stiffener 140 and side surfaces 126 of substrate 120 are positioned adjacent protrusions 132 of stiffener 140 as shown in FIGS. 3B and 4B. Ramp surface 128 of substrate 120 is also positioned in contact with corresponding ramp surfaces 149 of stiffener 140.

FIG. 4B provides a transparency of substrate 120 bonded to stiffener 140 which shows central aperture 150 of stiffener even though at least chip 130 of substrate 120 is covering central aperture 150 when substrate 120 is bonded to stiffener 140.

Subassembly 100 may be design according to particular specifications. For example, the weight of subassembly 100 should be less than 130 g total so that the ball grid array ("BGA") is not crushed during solder reflow. In one example, the optimized weight of stiffener 140 plus hardware or rivet nuts 180 is less than 50 g. With the chip 130 on substrate 120 or printed circuit board (PCB) being less than 25 g and the adhesive weight used to bond the substrate 120 and chip 130 to stiffener 140 being less than 5 g, the total package weight of subassembly 100 is approximately 80 g, which is well under the maximum 130 g weight specification for the total package. In other examples, stiffener 140 plus hardware 180 may be more or less than 50 g, the chip 130 on substrate 120 may be more or less than 25 g and the adhesive used to bond stiffener 140 to substrate 120 may be more or less than 5 g.

In designing the components of subassembly 100, the total thermal mass should be low and conductivity should be high such that heat can be applied from above to melt the solder underneath without damaging other components. The outer periphery of subassembly 100 may be design to fit on an existing tray. Adhesive and O-ring joints/surfaces should provide sealing for subassembly 100 for liquid water. The design of subassembly 100 should not promote any galvanic corrosion between electrolytically connected components. Thermal expansion of subassembly 100 should closely match the coefficient of a substrate it is bonded to for the purpose of minimizing thermal stresses.

According to some examples, the stiffener 140 may be made of AlSiC. Threaded hardware 180 may be attached after the AlSiC is fabricated. AlSiC is a metal-ceramic composite material consisting of silicon carbide particles (SiC) dispersed in a matrix of aluminum alloy (A) as shown, for example, in FIG. 5. The aluminum matrix contains high amount of dislocations, responsible for the strength of the material. The dislocations may be introduced during cooling by the SiC particles, due to their different thermal expansion coefficient.

AlSiC combines the benefits of high thermal conductivity (180-200 W/m K) of metal and low CTE of ceramic. With its composite features, AlSiC is an advanced packaging material for high technology thermal management. Its thermal expansion can be adjusted to match other materials, for example, silicon and gallium arsenide chips and various ceramics. When used in microelectronics as a substrate for power semiconductor devices and high density multi-chip modules, it aids with removal of waste heat.

Figures 5, 6:
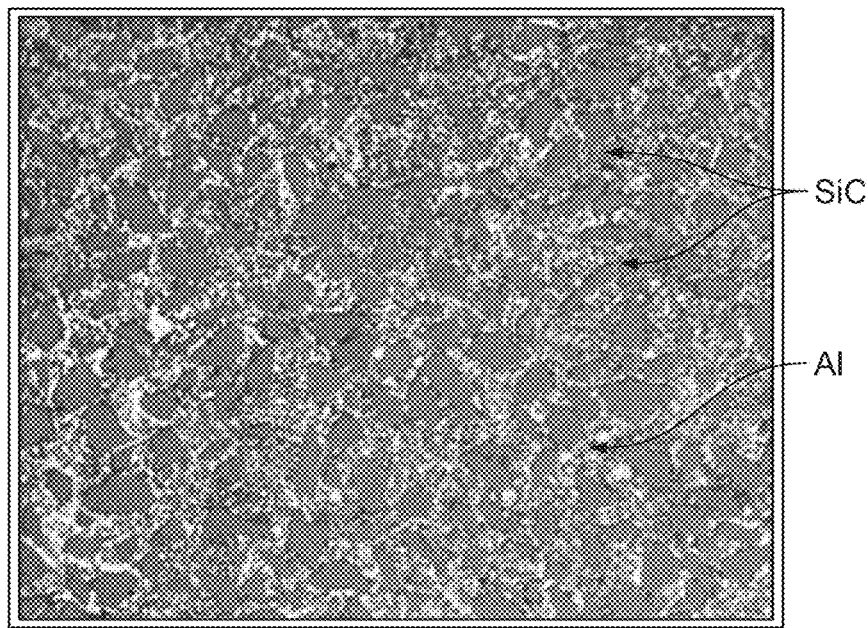
FIG. 5 is a magnified photo of an exemplary aluminum silicon carbide ("AlSiC") composite showing silicon carbide particles in an aluminum matrix.
FIG. 6 is a thermal comparison chart of particular materials in view of stiffener made of AlSiC.

FIG. 6 is a thermal comparison chart of particular materials in view of stiffener 140 made of AlSiC. As can be seen, AlSiC has a coefficient of thermal expansion that is at least half that of planar circuit boards (in plane), 304 Stainless Steel and copper, for example. AlSiC has a thermal conductivity less than half of that of copper, but a much higher thermal conductivity than a circuit board or 304 Stainless Steel. The strain at +50 degrees C. and relative strain as a function of percentage are highlighted between these materials as well.

FIG. 2A discussed above states that stiffener 140 is sintered together. AlSiC parts may also be manufactured by near net shape approach, by creating a SiC preform by metal injection molding of an SiC-binder slurry, fired to remove the binder, and then infiltrated under pressure with molten aluminum. Parts can be made with sufficiently low tolerances to not require further machining According to other examples, further processing of stiffener 140 may be performed to meet certain specifications.

AlSiC is fully dense, without voids, and is hermetic. AlSiC can be plated with nickel and nickel-gold or by other metals by thermal spraying. Ceramic and metal insets can be inserted into the preform before aluminum infiltration, resulting in a hermetic seal. AlSiC can be also prepared by mechanical alloying. When lower degree of SiC content is used, parts can be stamped from AlSiC sheets.

Figure 7A:
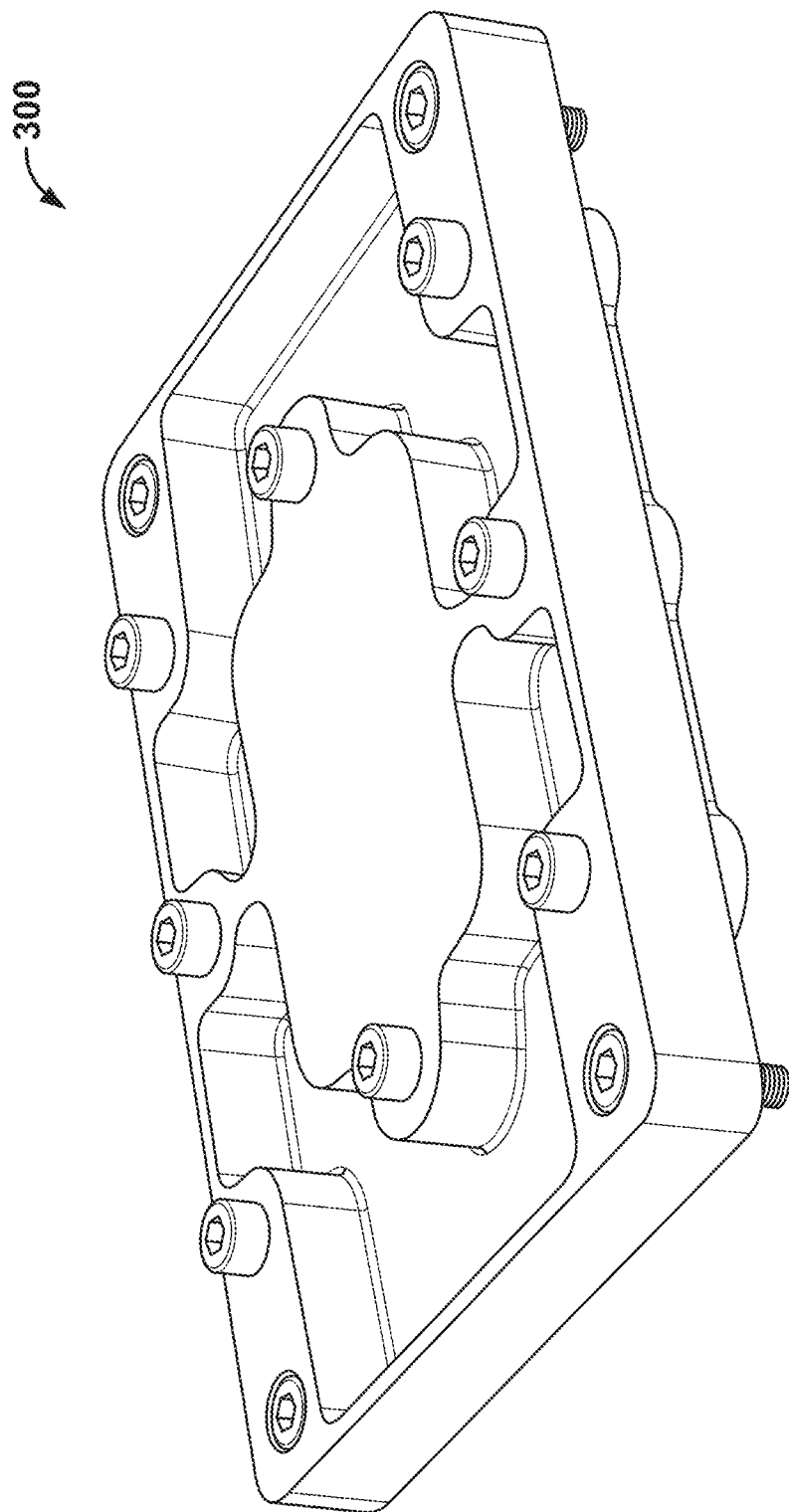
FIG. 7A is an assembled view of a mating assembly including a top plate secured to the subassembly of FIG. 1.
Figure 7B:
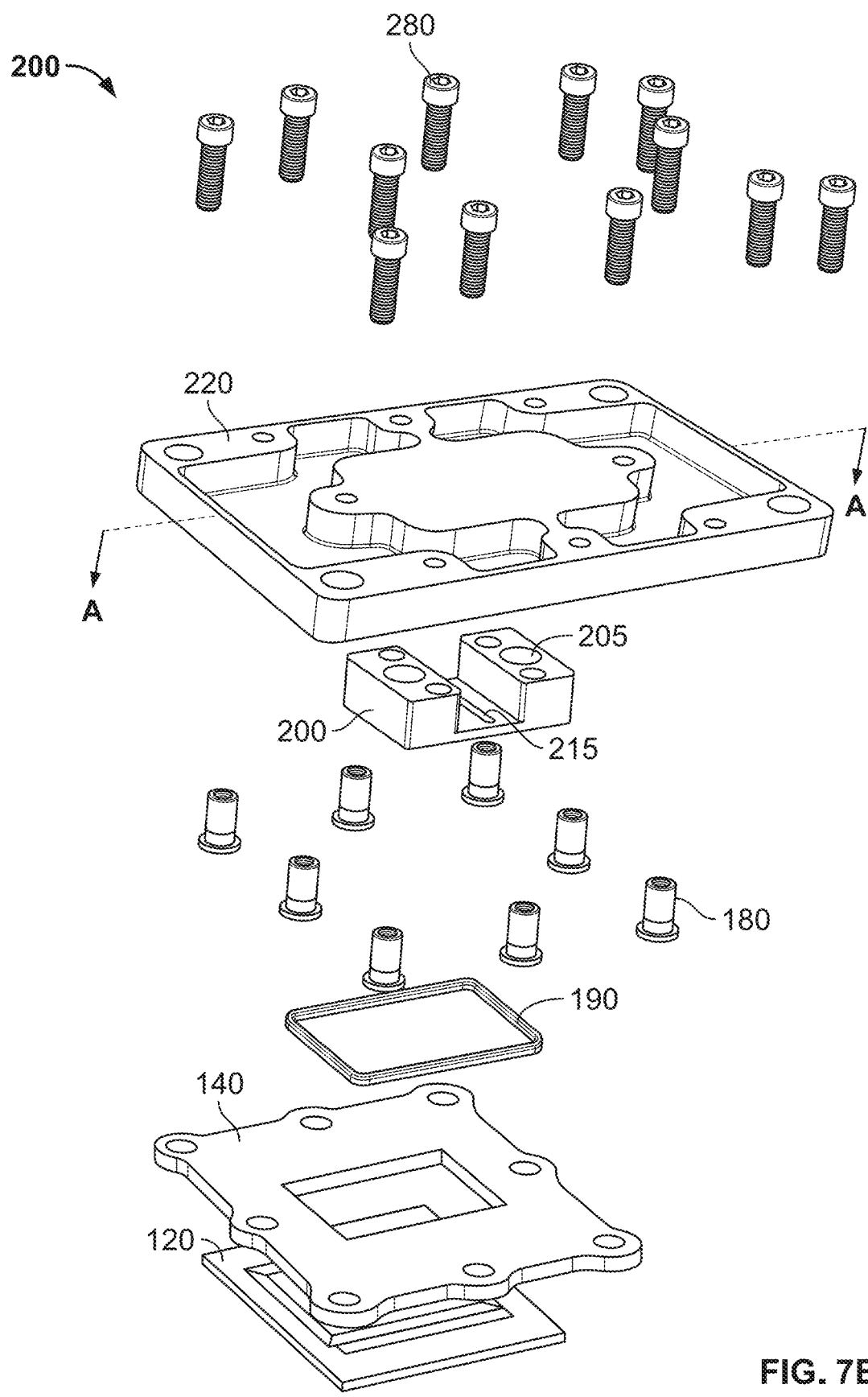
FIG. 7B is an exploded perspective view of the mating assembly of FIG. 7A.

FIG. 7A is an assembled view of a mating assembly 300 while FIG. 7B is an exploded view the mating assembly 300 showing each of the components thereof. Mating assembly 300 includes the components of subassembly 100, namely substrate 120 and chip 130, stiffener 140, adhesive 170 and hardware 180 as well as the additional components of an O-ring 190, manifold 200, top plate 220 and fasteners 280.

Each fastener aperture or hole 160 in stiffener 140 corresponds to a respective aperture or hole 260 in top plate 220. For example, each of the plurality of holes 160 in stiffener 140 form a pair with a respective one of the plurality of holes 260 in the top plate 220. Each pair of the plurality of holes 260 are adapted to receive a portion of a fastener 280 therethrough for engaging threaded hardware 180 and coupling top plate 220 to stiffener 140 as shown in FIG. 7A.

Figure 7C:
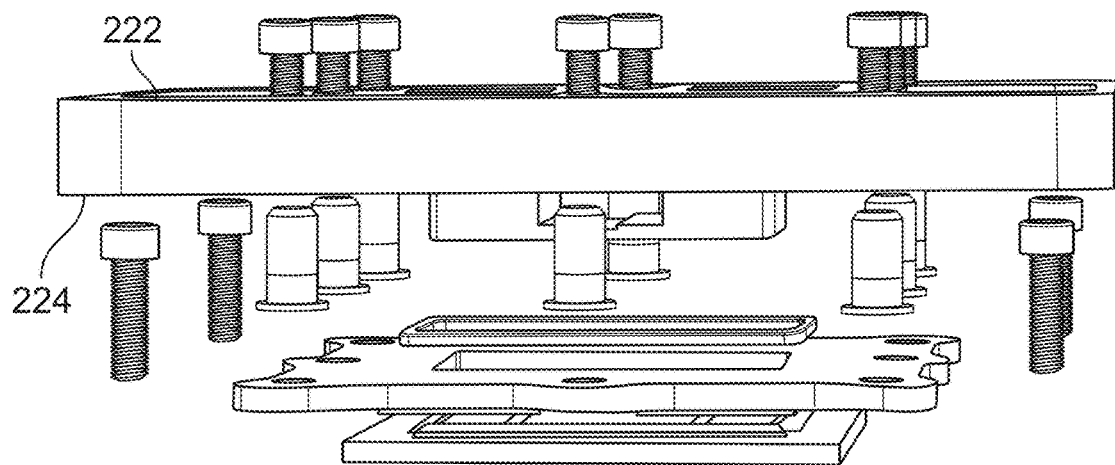
FIG. 7C is a side view of another exploded view of the mating assembly of FIG. 7A.
Figure 7D:
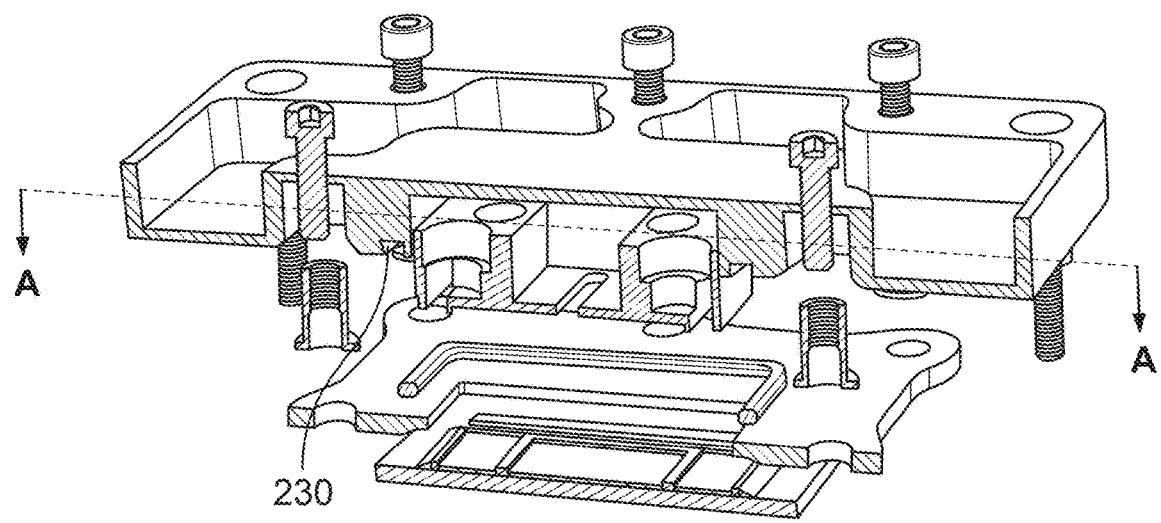
FIG. 7D is a cross-sectional view of the exploded side view of FIG. 7C taken along a line A-A defining a mid-point of the shorter side surfaces of the top plate.

Top plate 220 has top portion 222 as shown in FIG. 7A and a bottom portion 224 that can at least be partially be seen in the cross-sectional view of FIG. 7D. There is an arrow in FIG. 4A pointing toward top portion 222, which represents a flow regime or channels that would extend through the top portion 222 and bottom portion 224 that are not shown with respect to top plate 220. A groove 230 is formed in bottom portion 224 of top plate 220. Groove 230 is configured to retain O-ring 190 when top plate 220 is coupled to stiffener 140. In an exploded side view of mating assembly 300 as shown in FIG. 7C, and as shown in the corresponding cross-sectional view of FIG. 7D, the position of O-ring 190 with respect to central aperture 150 and its general orientation on stiffener 140 can be seen.

FIG. 7D also shows an exploded view of the enclosure that manifold 200 is configured to lie within. The enclosure is formed when substrate 120, stiffener 140 and top plate 220 are coupled together as shown in FIG. 7A. Manifold 200 is designed to direct flow over a microprocessor in order to significantly improve heat transfer between the microprocessor and the working fluid. A portion of manifold 200 is designed to lie within central aperture 150 of stiffener 140 and is in direct contact with chip 130 of substrate 120 when manifold 200 is within the enclosure formed by substrate 120, stiffener 140 and top plate 220. Manifold 200 sits on top of chip 130 with flow channels. It is designed with an intricate crossflow path for the coolant resulting in the improved crossflow path between chip 130 and the working fluid. Cooled fluid or liquid runs through an inlet channel 205 in manifold 200 and on to chip 130. Liquid that has previously been used to cool chip 130 is expelled through outlet channels 215.

When mating assembly 300 is fully assembled as shown in FIG. 7A, weight optimized stiffener 140 may provide sealing on top surface 142 thereof through the use of O-ring 190 and on bottom surface 144 thereof through the use of adhesive 170. The top plate has a groove in an inner surface thereof that is configured to retain the O-ring when the top plate is coupled to the stiffener.

Stiffener 140 provides warpage control for a lidless package while enabling direct liquid cooling of chip 130 and/or substrate 120. Stiffener comprises weight optimization material such as AlSiC and geometry features such as irregularly shaped outer periphery 146. The weight optimization of stiffener 140 reduces its thermal mass and the impact of weight concentrations during attachment of stiffener 140, for example, to a motherboard.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A device, comprising:
    a weight optimized stiffener having a top surface, a bottom surface, an outer periphery and an inner periphery forming an aperture through the top and bottom surfaces,
    wherein the aperture is adapted to receive a portion of a substrate coupled to the bottom surface of the stiffener by an adhesive; and
    a top plate coupled to the top surface of the stiffener;
    wherein the stiffener has a plurality of holes corresponding to a plurality of holes in the top plate, each of the plurality of holes in the stiffener forming a pair with a respective one of the plurality of holes in the top plate, each pair of the plurality of holes adapted to receive a portion of a fastener therethrough for coupling the top plate to the stiffener.

2. The device of claim 1, wherein the stiffener is formed of silicon carbide particles in an aluminum matrix.

3. The device of claim 1, further comprising:
    the substrate coupled to the bottom surface of the stiffener by the adhesive, the portion of the substrate protruding into the aperture of the stiffener.

4. The device of claim 3, wherein the bottom surface of the stiffener has at least one recess for receiving at least one protrusion on the substrate.

5. The device of claim 3, wherein the bottom surface of the stiffener has a plurality of protrusions extending therefrom that lie adjacent to outer side surfaces of the substrate when the substrate is coupled to the bottom surface of the stiffener.

6. The device of claim 3, further comprising an O-ring for providing a seal between the stiffener and the top plate.

7. The device of claim 3, further comprising:
    a manifold configured to lie within an enclosure formed by the substrate, stiffener and top plate, the manifold configured to direct cooled liquid to the substrate.

8. The device of claim 7, wherein a portion of the manifold lies within the aperture of the stiffener and is in direct contact with the substrate when the manifold is within the enclosure formed by the substrate, stiffener and top plate.

9. The device of claim 1, wherein the outer periphery is irregularly shaped.

10. A device, comprising:
    a weight optimized stiffener having a top surface, a bottom surface, an outer periphery and an inner periphery forming an aperture through the top and bottom surfaces,
    wherein the aperture is adapted to receive a portion of a substrate coupled to the bottom surface of the stiffener by an adhesive;
    a top plate coupled to the top surface of the stiffener; and an O-ring for providing a seal between the stiffener and the top plate;

wherein the top plate has a groove in an inner surface thereof that is configured to retain the O-ring when the top plate is coupled to the stiffener.

11. An assembly, comprising:

a weight optimized stiffener having a top surface, a bottom surface, an outer periphery and an inner periphery forming an aperture through the top and bottom surfaces;

a substrate coupled to the bottom surface of the stiffener by an adhesive, a portion of the substrate protruding into the aperture of the stiffener;

a top plate coupled to the top surface of the stiffener; and a manifold configured to lie within an enclosure formed by the substrate, stiffener and top plate, the manifold configured to direct cooled liquid to the substrate.

12. The assembly of claim 11, wherein the stiffener is formed of silicon carbide particles in an aluminum matrix.

13. The assembly of claim 12, further comprising an O-ring for providing a seal between the stiffener and the top plate.

14. The assembly of claim 13, wherein the top plate has a groove in an inner surface thereof that is configured to retain the O-ring when the top plate is coupled to the stiffener.

15. The assembly of claim 11, wherein the bottom surface of the stiffener has at least one recess for receiving at least one protrusion on the substrate.

16. The assembly of claim 11, wherein the bottom surface of the stiffener has a plurality of protrusions extending therefrom that lie adjacent to outer side surfaces of the substrate when the substrate is coupled to the bottom surface of the stiffener.

17. The assembly of claim 11, wherein the stiffener has a plurality of holes corresponding to a plurality of holes in the top plate, each of the plurality of holes in the stiffener forming a pair with a respective one of the plurality of holes in the top plate, each pair of the plurality of holes adapted to receive a portion of a fastener therethrough for coupling the top plate to the stiffener.

18. The assembly of claim 11, wherein a portion of the manifold lies within the aperture of the stiffener and a bottom surface of the manifold is in direct contact with the substrate when the manifold is within the enclosure formed by the substrate, stiffener and top plate.

* * * * *